United States Patent
Kawamura et al.

[11] Patent Number: 5,982,176
[45] Date of Patent: Nov. 9, 1999

[54] GEOMAGNETIC DIRECTION SENSOR

[75] Inventors: Yoshihisa Kawamura; Kazuo Kurihara; Zenkichi Nakamura; Kietsu Iwabuchi; Toshio Aizawa; Hideo Suyama, all of Miyagi, Japan

[73] Assignee: Sony Corporation, Tokyo, Japan

[21] Appl. No.: 08/411,939

[22] Filed: Mar. 28, 1995

[30] Foreign Application Priority Data

Mar. 28, 1994 [JP] Japan .................................... 6-057854

[51] Int. Cl.$^6$ .......................... G01R 33/06; G01C 17/32; G01C 17/28
[52] U.S. Cl. .......................... 324/252; 324/247; 33/355 R
[58] Field of Search .................................... 324/244, 247, 324/249, 251, 252, 260, 207.2, 207.21; 338/32 R, 32 H; 360/113, 112; 33/355 R, 361

[56] References Cited

U.S. PATENT DOCUMENTS

| | | | |
|---|---|---|---|
| 3,260,932 | 7/1966 | Weiss et al. | 324/252 |
| 3,849,724 | 11/1974 | Ghibu et al. | 324/207.21 |
| 3,905,121 | 9/1975 | Takeda et al. | 324/247 |
| 4,668,913 | 5/1987 | Vinal | 324/207.21 |
| 4,849,696 | 7/1989 | Brun et al. | 324/252 |
| 4,901,177 | 2/1990 | Lazzari | 360/113 |
| 4,954,920 | 9/1990 | Yamada et al. | 360/113 |

FOREIGN PATENT DOCUMENTS

| | | |
|---|---|---|
| 1063037 | 3/1967 | United Kingdom . |
| 1249497 | 10/1971 | United Kingdom . |
| WO 93/13386 | 7/1993 | WIPO . |

*Primary Examiner*—Walter E. Snow
*Attorney, Agent, or Firm*—Hill & Simpson

[57] ABSTRACT

A geomagnetic direction sensor has a plurality of magnetic cores for converging terrestrial magnetism arranged circumferentially with pre-set gaps, and magneto-resistive effect devices in the gaps so as to lie substantially at right angles to the direction of the magnetic field in the gaps. The geomagnetic direction sensor has at least a pair of magneto-resistive effect devices lying substantially at right angles to each other. The magnetic core is formed of a magnetic material having soft magnetic properties. The current is supplied to the excitation coils placed around the magnetic core for applying a bias magnetic field to the magneto-resistive effect devices. Another set of magneto-resistive effect devices are connected in series with the magneto-resistive effect devices arranged within the gap so as to be substantially parallel to the direction of the magnetic field.

18 Claims, 8 Drawing Sheets

CONVENTIONAL DEVICE

CONVENTIONAL DEVICE

CONVENTIONAL DEVICE

GEOMAGNETIC DIRECTION SENSOR

BACKGROUND OF THE INVENTION

This invention relates to a geomagnetic direction sensor employing a magneto-resistance effect device.

In a color cathode ray tube, for example, the trajectory of an electron beam outgoing from an electron gun is occasionally bowed by terrestrial magnetism so that the electron beam is changed in its landing position on the fluorescent surface. In a high-definition cathode ray tube, changes in the landing (position deviation) tends to raise the problem of deteriorated color purity because of the small landing allowance.

For compensating these changes, a landing compensation coil is usually mounted on a cathode ray tube. An optimum current required for landing correction is caused to flow in the landing compensation coil, depending on the direction of the terrestrial magnetism, for controlling the trajectory of the electron beam for preventing mistaken landing.

Thus it is necessary to correctly detect the direction of the terrestrial magnetism. For this reason, a so-called geomagnetic direction sensor has been employed.

Such geomagnetic direction sensor is also employed as a goniometer in substitution for a conventional magnet goniometer (magnetic compass).

Among known types of the construction of the geomagnetic direction sensor, employed for a variety of usages, there are a so-called flux gate type and a magneto-resistive effect type.

The former construction of the geomagnetic direction sensor has a permalloy core 101 on which are wound a coil 102 for outputting electrical signals and an excitation coil 103, as shown in FIG. 1. The terrestrial magnetism is concentrated by the permalloy core 101 and thence transmitted to the coil 102 for outputting electrical signals.

With such flux gate type geomagnetic direction sensor, an ac bias magnetic field $H_B$ is generated by the excitation coil 103 in the permalloy core 101 and a pulsed electrical voltage generated on inversion of the bias magnetic field is detected as a signal. The voltage value of such pulsed electrical voltage is changed with the direction of terrestrial magnetism and hence may be utilized as a terrestrial magnetism sensor.

However, since the flux gate type geomagnetic direction sensor converts the terrestrial magnetism into an electrical signal by a coil, it is necessary to increase the number of windings of the coil for outputting electrical signals 102 for improving sensitivity or to increase the size of the permalloy core 101 for improving the effect of concentration. Thus it is difficult to reduce the size or production cost of the sensor.

The latter construction of the geomagnetic bearing sensor has a magneto-resistive sensor chip 110 having a magneto-resistive effect device 111 and an air-core coil 112 within which an MR sensor chip 110 is introduced, as shown in FIG. 2. An ac bias magnetic field $H_B$ is applied in a 45° direction with respect to the MR sensor chip 110. FIG. 3 shows an equivalent circuit of the sensor. When the sensor is employed as the geomagnetic direction sensor, a set of the assemblies shown in FIG. 2 are used so that directions of the air-core coils are at right angles to each other.

Since the MR type geomagnetic direction sensor utilizes the magneto-resistive effect device, it is higher in sensitivity than the flux gate type geomagnetic direction sensor. However, since it senses geomagnetism only by the MR sensor chip 110, the direction of terrestrial magnetism on the order of 0.3 Gauss can be detected only insufficiently.

On the other hand, since the MR type geomagnetic direction sensor applies the bias magnetic field HB in a 45°-direction with respect to the MR sensor chip 110, and an intentionally acute curve for MR characteristics is used for improving the detection sensitivity, the MR characteristics exhibit hysteresis, which has to be resolved by a complicated signal processing circuit. In addition, the direction detection accuracy is a low as ±10°.

Thus the conventional geomagnetic direction sensor leaves much to be desired in detection sensitivity, while it can be reduced in size and production cost only with considerable difficulties.

OBJECT AND SUMMARY OF THE INVENTION

In view of the foregoing, it is an object of the present invention to provide a geomagnetic bearing sensor having practically high sensitivity and which may be easily reduced in size and production cost.

According to the present invention, there is provided a geomagnetic direction sensor having a plurality of circumferentially arranged magnetic cores, with pre-set gaps in-between, for converging the terrestrial magnetism. The geomagnetic direction sensor has plural magneto-resistive effect devices (MR sensors) for extending substantially at right angles to the direction of the magnetic field in the gaps.

The MR sensors are arranged at at least two positions for generating outputs along the X-axis and the Y-axis at right angles to each other. Preferably, four of the MR sensors are arranged at an equal angular interval of 90°.

The magnetic cores are arrayed circumferentially at an equal angular interval of, for example, 90°, depending on the array of the MR sensors, for defining gaps and producing a closed magnetic path. The magnetic cores are preferably arranged so as to remain symmetrical after rotation through 90° and specifically in the form of a toroid or a square.

The magnetic cores are formed of a soft magnetic material having high magnetic permeability and high saturation magnetic flux density, such as permalloy, silicon steel plates or a variety of soft ferrites, and are used for impressing the bias magnetic field and for converging the terrestrial magnetism.

To this end, excitation coils are placed around the magnetic cores and fed with the current for generating the bias magnetic field $H_B$ so that the MR sensors will be employed at a portion of an MR characteristic curve exhibiting high magnetic field sensitivity and high linearity. The current $I_B$ generating the bias magnetic filed $H_B$ may be direct current or alternating current, as desired.

However, the current value of the current $I_B$ is selected so as to generate the bias magnetic field $H_B$ having magnetic permeability substantially equal to that of a main magnetic portion (the closed magnetic path constituted by the magnetic cores) and magnetic flux density lower than the saturation magnetic flux density of the magnetic portion, thereby evading the range of rotational magnetization and providing allowance in the quantity of magnetization of the main magnetic portion as well as enhancing convergence of terrestrial magnetism.

If the MR sensor is used with the ac bias, the direction signal of a lower frequency may be outputted as an electrical signal superimposed on an ac signal of a higher frequency. Thus the direction may be detected with high accuracy because noise components such as temperature drift or offsets generated by the MR sensors may be eliminated by e.g., a high-pass filter.

With the geomagnetic direction sensor of the present invention, a differential output is produced from a pair of MR sensors having the directions of the bias magnetic field different by 180° relative to each other. The MR sensors may be connected in series with another set of MR sensors for defining an electrical bridge circuit for stabilizing the detection output. The MR sensors not directly contributing the output are preferably arranged on the magnetic core for extending parallel to the field of the magnetic field (the direction of the bias magnetic field) for realizing a high output and high direction accuracy.

With the geomagnetic direction sensor of the present invention, the magnetic core constitutes the magnetic path of the bias magnetic field, while functioning as a horn for converging the terrestrial magnetism.

The result is that the total quantity of the terrestrial magnetism applied to the MR sensors extending at right angles to one another is determined by the angle between the terrestrial magnetism and the MR sensors, and is proportional to the length of a line drawn form the MR sensors to a geomagnetic line passing through the center of the closed magnetic path constituted by the magnetic cores.

Thus the terrestrial magnetism may be efficiently supplied as magnetic signals to the MR sensors so that a high detection output may be produced and the direction of terrestrial magnetic may be detected with high accuracy.

DESCRIPTION OF THE PREFERRED EMBODIMENTS

Figure 1:
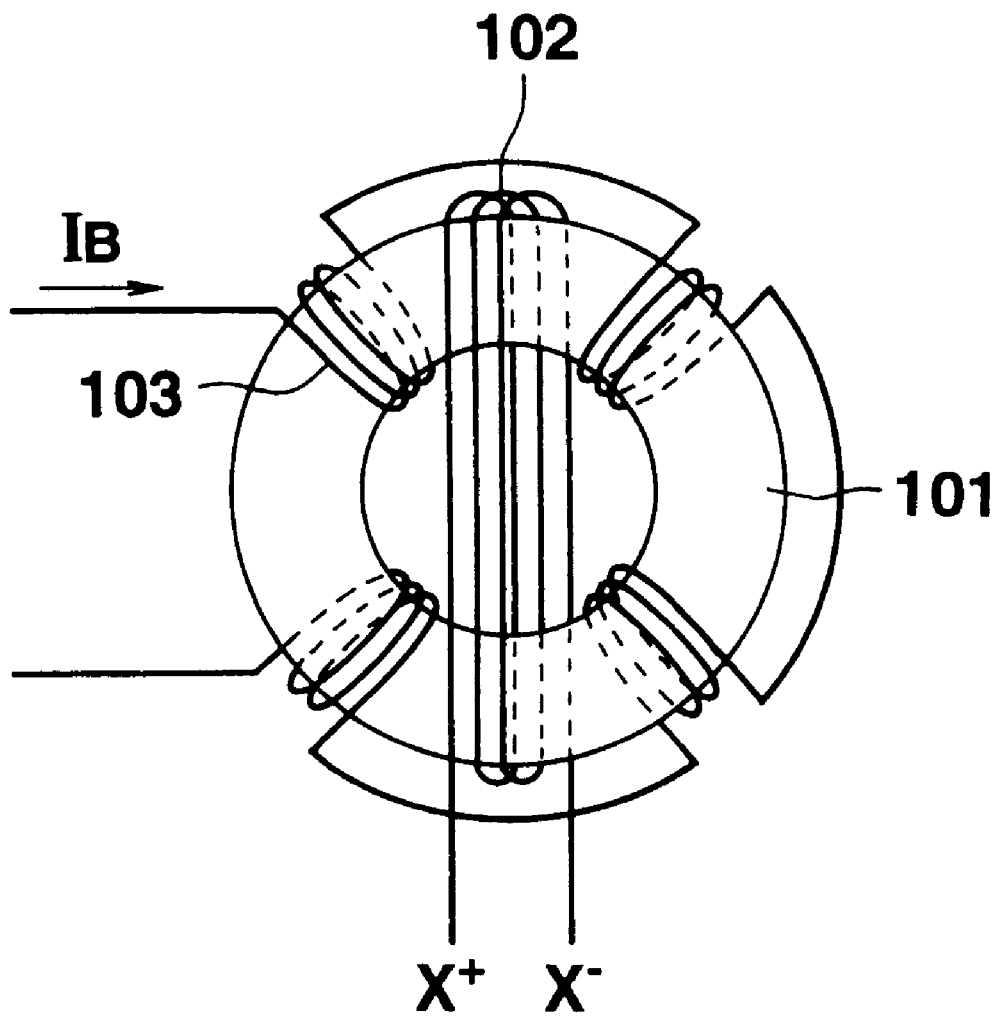
FIG. 1 is a schematic plan view showing a typical construction of a conventional flux gate type geomagnetic direction sensor.
Figure 2:
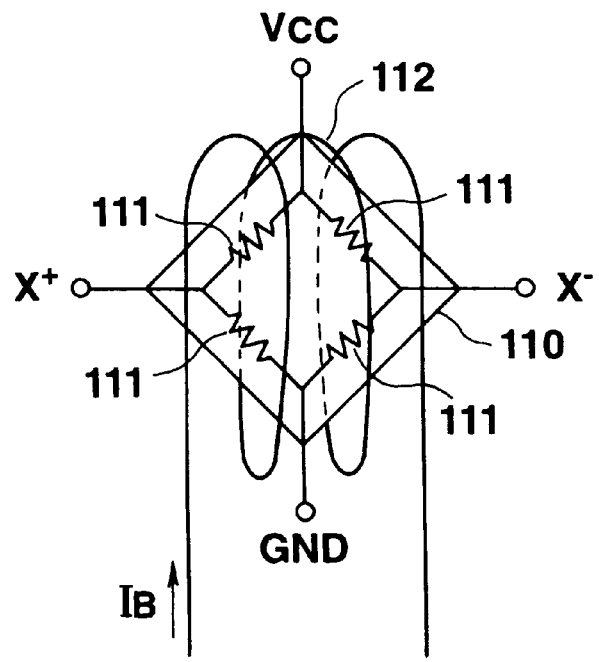
FIG. 2 is a schematic plan view showing a typical construction of a conventional MR type geomagnetic direction sensor.
Figure 3:
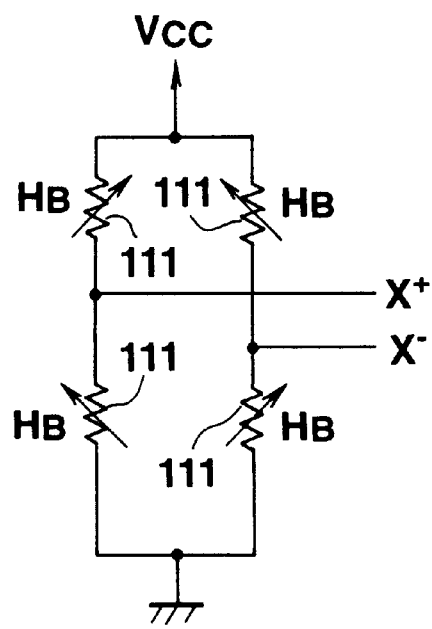
FIG. 3 is an equivalent circuit diagram showing the geomagnetic direction sensor shown in FIG. 2.

Referring to the drawings, preferred embodiments of the present invention will be explained in detail.

Figure 4:
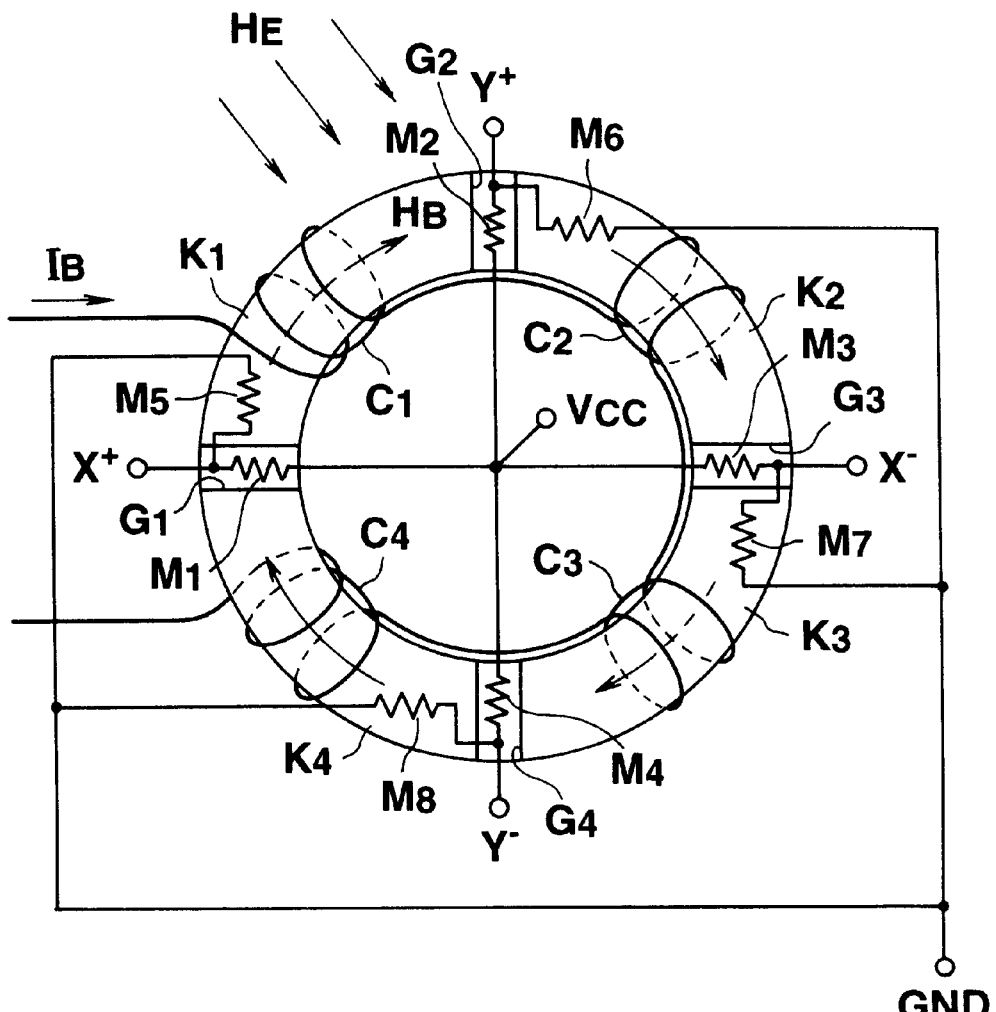
FIG. 4 is a schematic plan view showing atypical construction of a geomagnetic direction sensor according to the present invention.

FIG. 4 shows a typical basic construction of a geomagnetic direction sensor according to the present invention.

The present geomagnetic direction sensor is a group of four toroidally arranged magnetic cores of e.g., permalloy $K_1$, $K_2$, $K_3$ and $K_4$, having gaps $G_1$, $G_2$, $G_3$ and $G_4$ at an angular interval of 90°, within which are arranged MR sensors $M_1$, $M_2$, $M_3$ and $M_4$ respectively.

Figure 5:
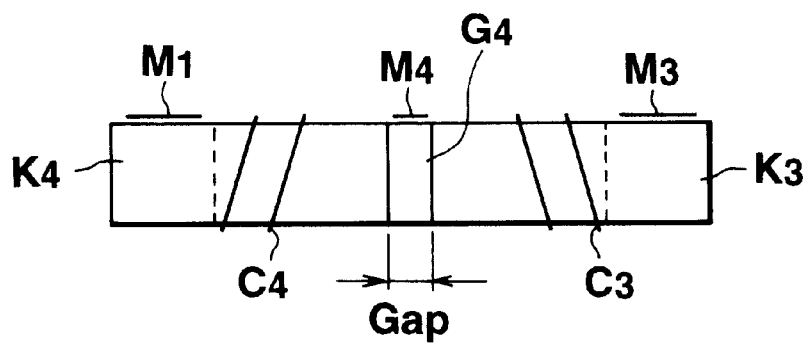
FIG. 5 is a schematic plan view showing atypical construction of the geomagnetic direction sensor shown in FIG. 4.

Excitation coils $C_1$, $C_2$, $C_3$ and $C_4$ are placed around the magnetic cores $K_1$, $K_2$, $K_3$ and $K_4$ for impressing a bias magnetic field $H_B$ at a right angle to the MR sensors $M_1$, $M_2$, $M_3$ and $M_4$, respectively. The MR sensors $M_1$, $M_2$, $M_3$ and $M_4$ are formed by the film forming technique and, as shown in FIG. 5, are formed above the gaps $G_1$, $G_2$, $G_3$ and $G_4$. Thus the bias magnetic field $H_B$ is applied substantially parallel to the film surfaces of the MR sensors $M_1$, $M_2$, $M_3$ and $M_4$, respectively.

The MR sensors $M_1$, $M_2$, $M_3$ and $M_4$, respectively are classified into two MR sensors $M_1$, $M_3$ for detection along the X-axis and two MR sensors $M_2$ and $M_4$ for detection along the Y-axis normal to the X-axis.

The MR sensors $M_1$, $M_2$, $M_3$ and $M_4$ are connected to MR sensors $M_5$, $M_6$, $M_7$ and $M_8$ for compensation of temperature characteristics, such as mid-point potential.

These MR sensors $M_5$, $M_6$, $M_7$ and $M_8$ for compensation of temperature characteristics are arranged outside of the gaps, hence on the magnetic cores $K_1$, $K_2$, $K_3$ and $K_4$ at right angles to the MR sensors $M_1$, $M_2$, $M_3$ and $M_4$, respectively, that is parallel to magnetic signals in the magnetic cores $K_1$, $K_2$, $K_3$ and $K_4$, respectively, for the following reason.

If the MR sensors for compensation of temperature characteristics $M_5$, $M_6$, $M_7$ and $M_8$ are arranged at right angles to the MR sensors for sensing terrestrial magnetism $M_1$, $M_2$, $M_3$ and $M_4$, respectively, the MR sensors $M_5$, $M_6$, $M_7$ and $M_8$ become substantially insensitive to magnetic signals in the magnetic cores $K_1$, $K_2$, $K_3$ and $K_4$. When the MR sensors $M_5$, $M_6$, $M_7$ and $M_8$ are arranged parallel to the bias magnetic field, they exhibit sensitivity equal to 1/100 or less that when the MR sensors $M_5$, $M_6$, $M_7$ and $M_8$ are arranged at right angles to the bias magnetic field.

Thus the differential output of a larger value and hence higher bearing accuracy on the order of ±1° may be achieved.

Figure 6:
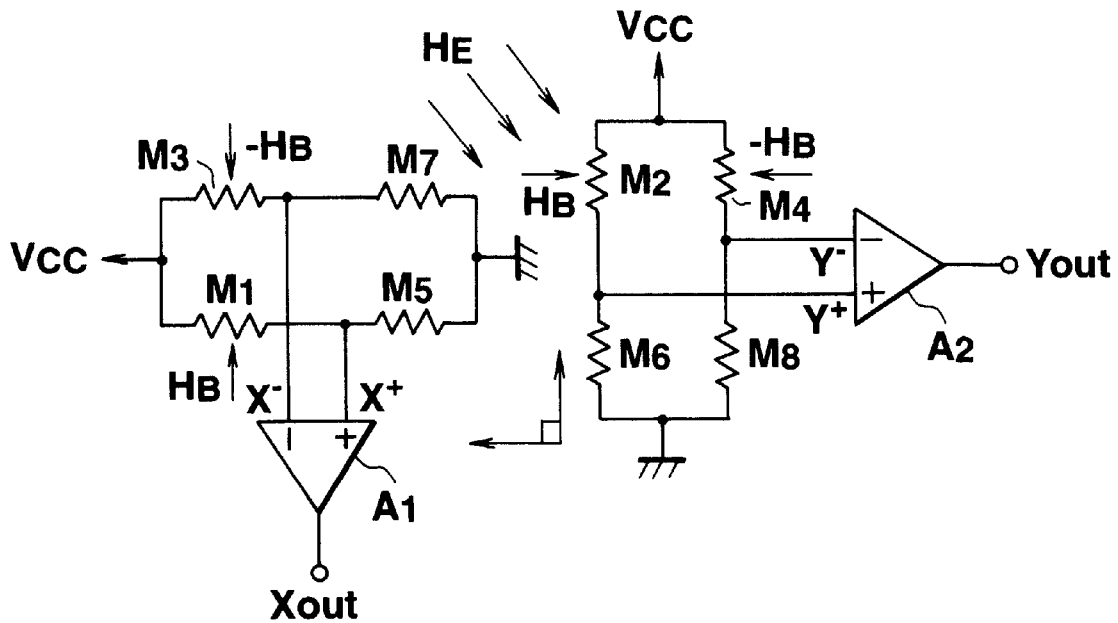
FIG. 6 is a circuit diagram showing an equivalent circuit of the geomagnetic direction sensor shown in FIG. 4.

FIG. 6 shows an equivalent circuit of the above-described geomagnetic direction sensor. That is, the two MR sensors for detection along the X-axis $M_1$, $M_3$ and the two MR sensors for the Y-axis normal to the X-axis $M_2$ and $M_4$ are connected to one another in an electrical bridge circuit, an output X of which is outputted at a differential amplifier $A_1$.

Similarly, the two MR sensors for detection along the Y-axis $M_2$, $M_4$ and the two MR sensors for temperature compensation $M_6$ and $M_8$ are connected to one another in an electrical bridge circuit, an output Y of which is outputted at a differential amplifier $A_2$.

The MR sensors for sensing terrestrial magnetism $M_1$, $M_2$, $M_3$ and $M_4$ are connected to a constant potential power source Vcc and thereby fed with the sense current.

The bias magnetic fields $H_B$ and $-H_B$ different in direction by 180° are applied to the two MR sensors for detection along the X-axis $M_1$, $M_3$, while the bias magnetic fields $H_B$ and $-H_B$ different in direction by 180° are applied to the two MR sensors for detection along the Y-axis $M_2$ and $M_4$.

In the above-described geomagnetic bearing sensor, the MR sensors $M_1$, $M_2$, $M_3$ and $M_4$ have the following features:
(i) the resistance values are changed with changes in the intensity of the magnetic field (magneto-resistive effects);
(ii) the ability to sense the weak magnetic field is high; and
(iii) changes in resistance may be taken as electrical signals.

The geomagnetic direction sensor according to the present invention takes advantage of these features for converting magnetic signals by terrestrial magnetism into electrical signals.

Figure 7:
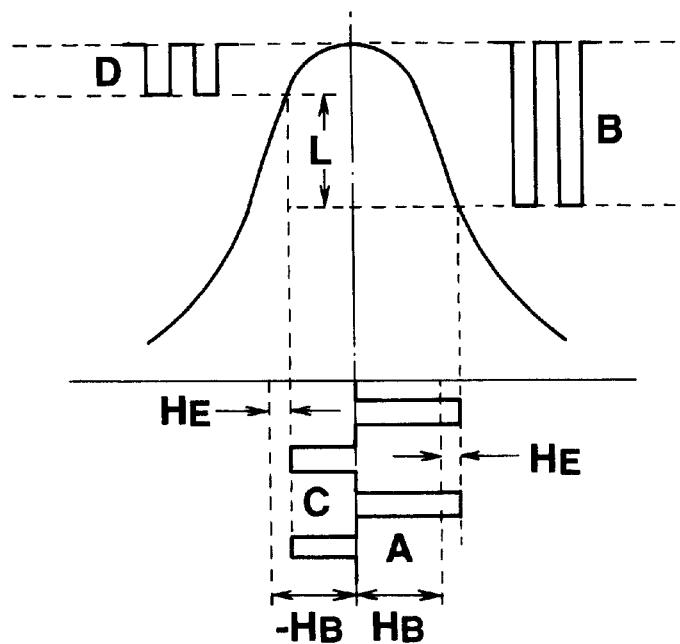
FIG. 7 is a graph showing magneto-resistive effect characteristics of an MR sensor.

FIG. 7 shows MR characteristic curve of the MR sensor. In this figure, the abscissa stands for the intensity of the magnetic field applied at right angles to the MR sensor and the ordinate stands for changes in the resistance value of the MR sensor or changes in the output voltage in case the dc current is caused to flow in the MR sensor.

The resistance value of the MR sensor becomes maximum for the zero magnetic field and becomes smaller by about 3% on application of a larger magnetic field which is on the order of 100 to 200 Gauss depending on e.g., the pattern shape of the MR sensor.

Figure 8:
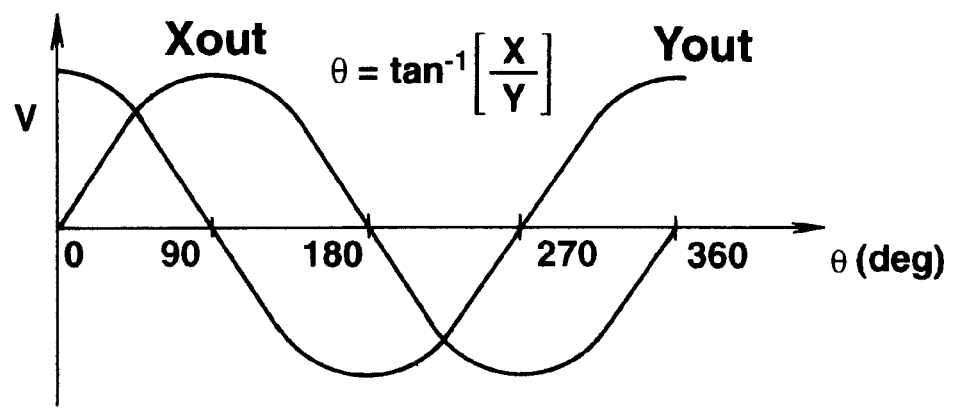
FIG. 8 is a graph showing the relation between the output voltage and the direction.

For improving the S/N ratio of the MR sensor output and the distortion factor, the bias magnetic field $H_B$ as shown in FIG. 8 is required. The bias magnetic field $H_B$ is furnished by supplying the current $I_B$ in the excitation coils $C_1$, $C_2$, $C_3$ and $C_4$ respectively placed around the magnetic cores $K_1$, $K_2$, $K_3$ and $K_4$.

At this time, the direction of the bias magnetic field applied to the MR sensor for detection along the X-axis $M_1$ and that applied to the MR sensor $M_3$ are inverted 180° relative to each other. Similarly, the direction of the bias magnetic field applied to the MR sensor for detection along the Y-axis and $M_2$ that applied to the MR sensor $M_4$ are inverted 180° relative to each other.

If a geomagnetic signal $H_E$ is supplied, the intensities of the magnetic fields applied to the MR sensors for detection along the X-axis $M_1$ and $M_3$ are such that the intensity at the MR sensor $M_1$: $H_B+H_E$ the intensity at the MR sensor $M_3$: $-H_B+H_E$ On application of the ac bias magnetic field, the magnetic field applied to the MR sensor $M_1$ is changed as shown by a line A in FIG. 7. These changes in the magnetic field are outputted as voltage changes as shown by a line B in FIG. 7. On the other hand, the magnetic field applied to the MR sensor $M_3$ is changed as shown by a line A in FIG. 7. These changes in the magnetic field are outputted as voltage changes as shown by a line D in FIG. 7.

An output difference L between an output B of the MR sensor $M_1$ and an output D of the MR sensor $M_3$ is taken out as a differential signal (output X). The same holds true for the MR sensors for detection along the Y axis $M_2$, $M_4$, such that a differential output (output Y) is produced.

These differential signals are changed with the direction of the terrestrial magnetism $H_E$, and are proportional to $H_E\sin\Theta$ and $H_E\cos\Theta$, respectively. Consequently, if the output voltage is plotted with the direction $\Theta$ taken on the abscissa, the outputs X and Y are as shown in FIG. 8.

Consequently, the geomagnetic direction $\Theta$ may be calculated from these outputs X and Y.

Since these outputs X and Y are proportionate to $H_E\sin\Theta$ and $H_E\cos\Theta$, respectively, the ratio of the outputs X to Y (X/Y) may be represented as $\sin\Theta/\cos\Theta$.

$$X/Y = \sin\Theta/\cos\Theta = \tan\Theta.$$

Consequently, $$\Theta = \tan_{-1}(X/Y)$$

where $x \geq 0$ for $0 \leq \Theta \leq 180°$ and $X<0$ for $180° < \Theta < 360°$.

From the foregoing, the direction $\Theta$ of the terrestrial magnetism $H_E$ can be known. The principle of concentration of the terrestrial magnetism by the magnetic cores $K_1$, $K_2$, $K_3$ and $K_4$ is now explained.

Figure 9:
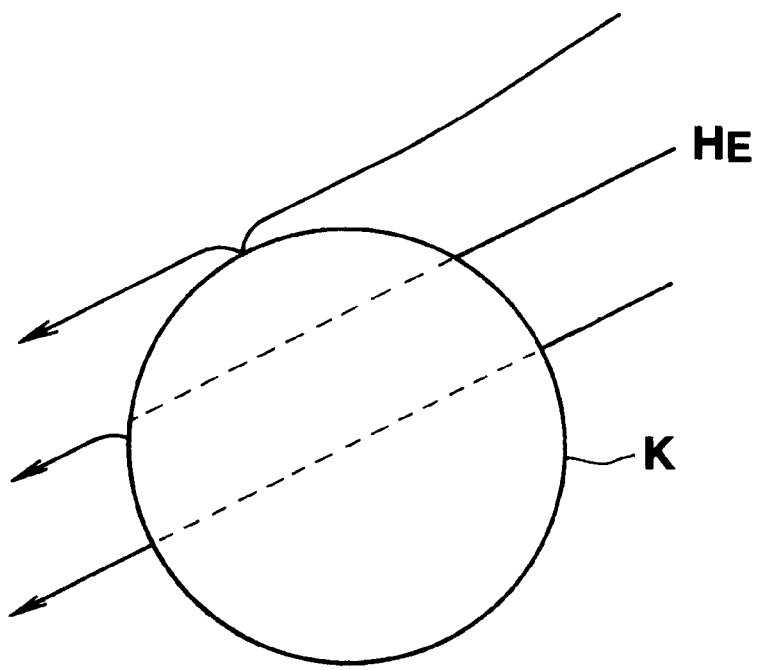
FIG. 9 is a diagrammatic view showing the state of concentration of terrestrial magnetism by a magnetic core.

FIG. 9 schematically shows how the magnetic cores K formed of ferrite or permalloy affects the terrestrial magnetism.

Since the magnetic material is smaller in magnetic reluctance than air, the terrestrial magnetism is bowed so as to be thereby attracted and again exits via the toroidal magnetic core K.

Thus the magnetic core K converges the terrestrial magnetism and converts it into magnetism with a high magnetic flux density. In effect, the terrestrial magnetism magnetizes the magnetic core K to produce a large magnetic field in the gap region.

Figure 10:
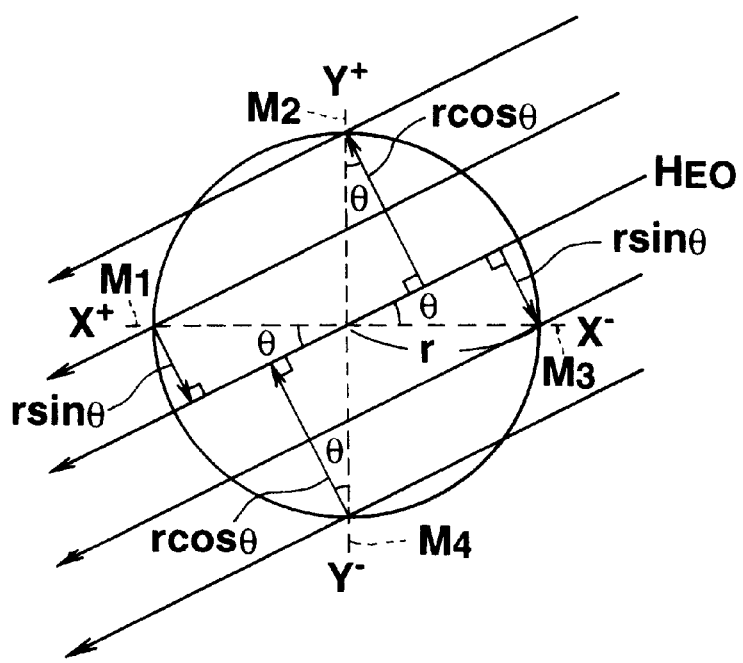
FIG. 10 is a diagrammatic view showing the total quantity of terrestrial magnetism applied to each MR sensor with the use of a circular core.

FIG. 10 shows how the terrestrial magnetism is transmitted to MR sensors $M_1$, $M_2$, $M_3$ and $M_4$ in case of using a toroidal magnetic core K. The total quantity of the terrestrial magnetism applied as a magnetic signal to the MR sensors $M_1$, $M_2$, $M_3$ and $M_4$ corresponds to the sum of lines drawn from the respective MR sensors $M_1$, $M_2$, $M_3$ and $M_4$ to the geomagnetic line $H_{E0}$ passing through the center of the magnetic core K.

the total quantity of terrestrial magnetism applied to each of the two MR sensors $M_1$, $M_3$ for detection along the X-axis:

$r\sin\Theta$ the total quantity of terrestrial magnetism applied to each of the two MR sensors $M_2$, $M_4$ for detection along the Y-axis:

$r\cos\Theta$

Consequently, the direction of the terrestrial magnetism $H_E$ can be calculated from the outputs of the geomagnetic direction sensor (outputs X and Y) issued on the basis of the total quantity of terrestrial magnetism in accordance with the previous equation.

Figure 11:
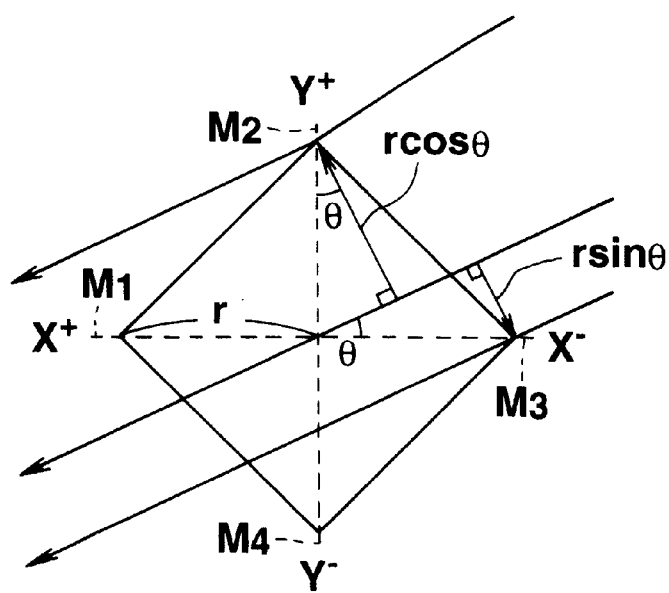
FIG. 11 is a diagrammatic view showing the total quantity of terrestrial magnetism applied to each MR sensor with the use of a square-shaped core.

The above holds true for the case in which the magnetic core K is square-shaped, as shown in FIG. 11. Similar outputs may be produced if the magnetic core has a symmetrical shape when it is rotated through 90° about the center of the magnetic core K as the center of rotation.

If the magnetic cores $K_1$, $K_2$, $K_3$ and $K_4$ functioning as cores of the excitation coils $C_1$, $C_2$, $C_3$ and $C_4$ are formed as soft magnetic members and used as converging horns for terrestrial magnetism, the output becomes larger than when the air-core coil or a magnet is employed, thus improving the detection sensitivity.

The present inventors conducted the following experiments for ascertaining actual effects.

As the magnetic cores, four Ni-Zn ferrite cores, each having the inside diameter of 15 mm, an outside diameter of 25 mm, a thickness of 2 mm and a gap width of 0.5 mm, were prepared. The geomagnetic direction sensor was assembled with the number of turns of the coils equal to 120 and the bias current of 25 mA (the bias magnetic field to the MR sensor of 25 gauss) for measuring its output.

As a result, a maximum output of 12 mV could be achieved.

An output was similarly measured for a case in which the magnetic field of the same intensity (25 gauss) was applied by a magnet (Ba ferrite) with the use of the same MR pattern.

The maximum output in this case was 1 mV or less. Comparison between the two outputs indicates that the former is superior by 20 dB or more.

The reason such high sensitivity is obtained is thought to reside in the terrestrial magnetism being converged by the magnetic cores $K_1$, $K_2$, $K_3$ and $K_4$ so as to be applied to the MR sensors within the gap region.

The above testifies to the advantage in employing the so-called soft magnetic core as a core of the excitation coil.

A modification of the present invention which significantly facilitates the preparation of the geomagnetic direction sensor is hereinafter explained.

Although the geomagnetic direction sensor of the present modification is similar in basic construction and in operating principle to the previously described embodiment, it may be prepared more easily since the magnetic core is mounted by bonding to the MR sensor.

Figure 12:
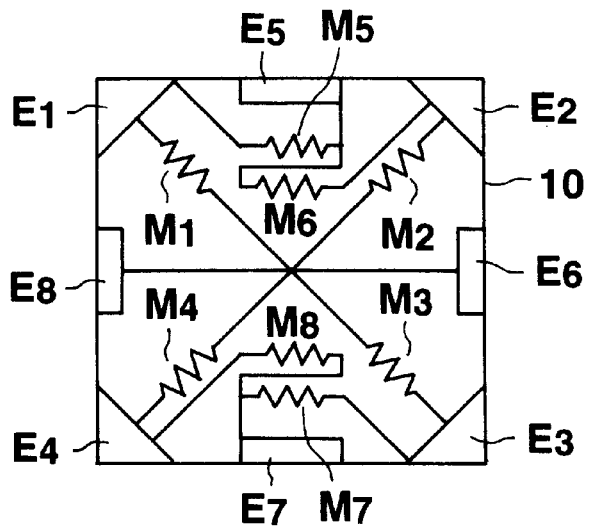
FIG. 12 is a schematic plan view showing am MR sensor chip of a geomagnetic direction sensor according to a modification.

FIG. 12 shows an MR sensor chip on which an MR sensor is formed. This MR sensor chip has a glass chip 10 on which the MR sensors for sensing terrestrial magnetism $M_1$, $M_2$, $M_3$ and $M_4$ and the MR sensors $M_5$, $M_6$, $M_7$ and $M_8$ for compensation of temperature characteristics are patterned by e.g., a photolithographic technique.

The interconnection between these MR sensors is simultaneously patterned and electrodes $E_1$ to $E_8$ for establishing electrical connection with an external circuit are also formed.

Figure 13:
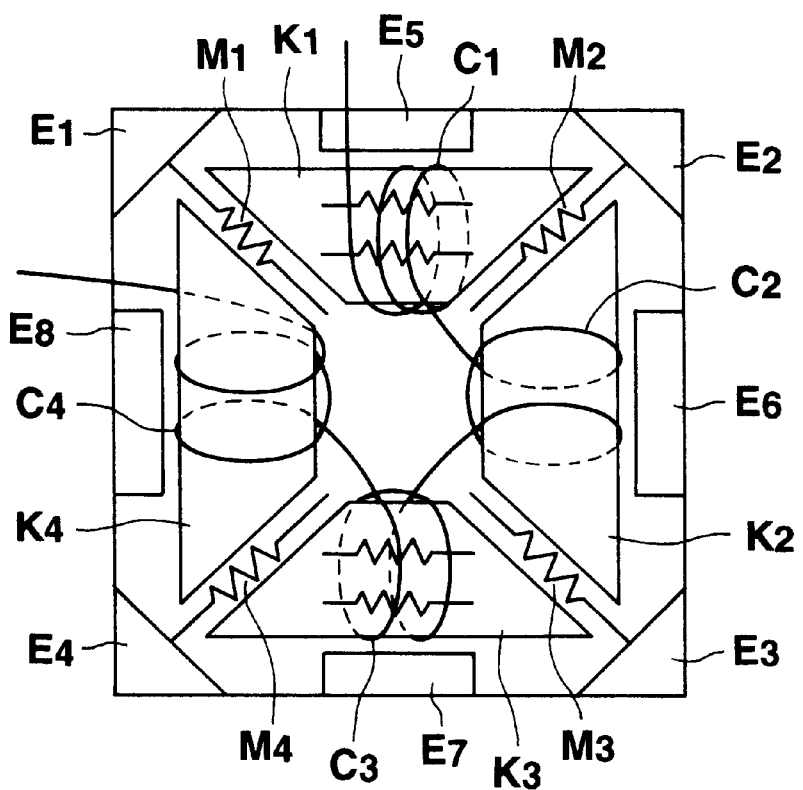
FIG. 13 is a schematic plan view showing the state in which a magnetic core is bonded to the MR sensor chip.

The geomagnetic direction sensor having an equivalent construction to that shown in FIG. 4 can be fabricated at low cost by bonding on the MR sensor chip the magnetic cores $K_1$, $K_2$, $K_3$ and $K_4$, on which the exciting coils $C_1$, $C_2$, $C_3$ and $C_4$ are placed, as shown in FIG. 13.

In the present modification, the magnetic path defined by the magnetic cores $K_1$, $K_2$, $K_3$ and $K_4$ is a square-shaped closed magnetic path and, by adjusting the bonding position of the magnetic cores $K_1$, $K_2$, $K_3$ and $K_4$, the gaps $G_1$, $G_2$, $G_3$ and $G_4$ are formed, and the MR sensors for sensing geomagnetism $M_1$, $M_2$, $M_3$ and $M_4$ may be arranged within these gaps.

With the above-described geomagnetic direction sensor, the equivalent circuit shown in FIG. 6 may be completed by connecting Vcc to the electrode $E_6$ or $E_8$, grounding the electrodes $E_5$ and $E_7$, connecting a differential amplifier for the X-axis between the electrodes $E_1$ and $E_3$ and by connecting a differential amplifier for the Y-axis between the electrodes $E_2$ and $E_4$.

Alternatively, the method of impressing the bias magnetic field may be arbitrarily set by suitably selecting the connection of the MR sensor MR or the differential amplifier A or the bonding position of magnetic cores $K_1$, $K_2$, $K_3$ and $K_4$.

Figure 14:
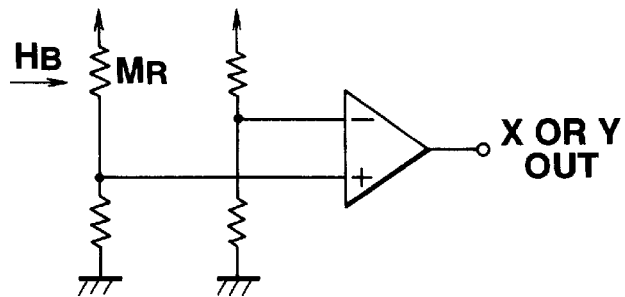
FIG. 14 is an equivalent circuit diagram of a unipolar bias system.
Figure 15A:
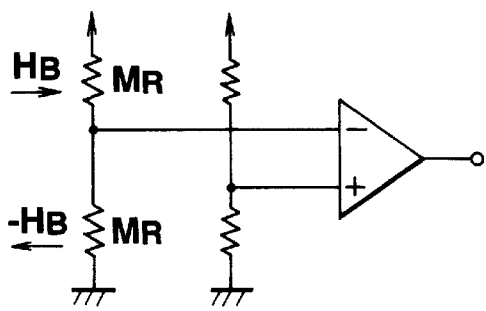
FIGS. 15A and 15B are an equivalent circuit diagram of a bipolar bias system.
Figure 15B:
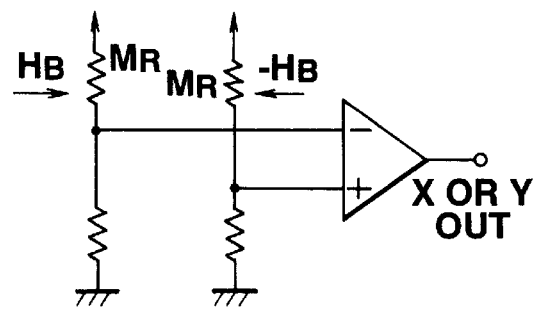
Figure 16:
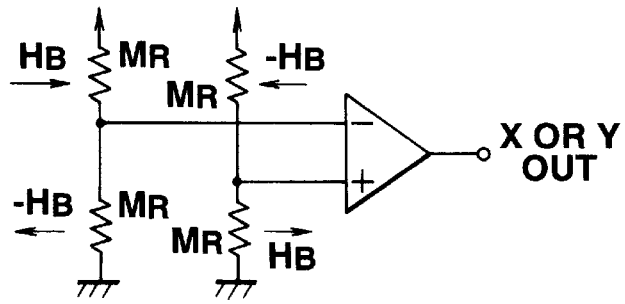
FIG. 16 is an equivalent circuit diagram of a tetrapolar bias system.

FIGS. 14 to 16 illustrate examples of a unipolar bias system, a bipolar bias system and a multipolar bias system, respectively. The geomagnetic direction sensor may also be constructed by employing a MR sensor for the X-axis and another MR sensor for the Y-axis and suitably combining these two MR sensor chips.

Since many different embodiments may be made without departing from the spirit and scope of the present invention, it is to be understood that the invention is not limited to the above-described specific embodiments and may comprise any modifications as may be encompassed by the following claims.

What is claimed is:

1. A geomagnetic direction sensor comprising:
   a non-magnetic substrate:
   a plurality of adjacent magnetic cores, bonded to said non-magnetic substrate to define a circumference with gaps in-between;
   magneto-resistive effect devices arranged at said gaps extending in a direction substantially at right angles to a direction of a magnetic field in said gaps; and
   a means for generating a signal indicative of geomagnetic field operatively connected to said magneto-resistive effect devices.

2. The geomagnetic direction sensor as claimed in claim 1, further comprising at least one pair of the magneto-resistive effect devices lying substantially at right angles to each other.

3. The geomagnetic direction sensor as claimed in claim 1 comprising four mageto-resistive effect devices circumferentially spaced at an interval of 90°.

4. The geomagnetic bearing sensor as claimed in claim 1 wherein the magnetic core is formed of a magnetic material having soft magnetic properties.

5. The geomagnetic bearing sensor as claimed in claim 1 wherein the magnetic core is toroidally-shaped.

6. The geomagnetic bearing sensor as claimed in claim 1 wherein the magnetic core is square-shaped.

7. The geomagnetic direction sensor as claimed in claim 1, wherein excitation coils are placed around the magnetic cores and a bias magnetic field is applied to the magneto-resistive effect devices within the gaps by supplying current to said excitation coils.

8. The geomagnetic direction sensor as claimed in claim 1, further comprising additional magneto-resistive effect devices arranged substantially parallel to the direction of the magnetic field and connected in series with the magneto-resistive effect devices arranged at the gaps.

9. A geomagnetic sensor comprising:
   a plurality of adjacent magnetic cores arranged to define a perimeter having gaps between adjacent magnetic cores;
   a substrate adjacent to the magnetic cores;
   a first plurality of magneto-resistive sensors formed at the gaps; a plurality of temperature compensation magnetoresistive sensors formed on the substrate adjacent to the magnetic cores at right angles to corresponding ones of the first plurality of sensors; and
   a means for generating a signal indicative of a geomagnetic field operatively connected to said magneto-resistive effect devices.

10. The geomagnetic sensor of claim 9, wherein at least one pair of the first plurality of magneto-resistive sensors are at right angles to each other.

11. The geomagnetic sensor of claim 9 comprising four magneto-resistive effect devices circumferentially spaced at intervals of ninety degrees.

12. The geomagnetic sensor of claim 9, further comprising at least one excitation coil formed on one of said cores.

13. A method of generating a signal representative of a geomagnetic field comprising the steps of:
   providing a non-magnetic substrate;
   providing a plurality of magnetic cores and bonding said magnetic cores to said non-magnetic substrate to define a perimeter having gaps between adjacent magnetic cores;
   providing a first plurality of magneto-resistive sensors formed at the gaps; and generating a signal indicative of a geomagnetic field with said magneto-resistive sensors.

14. The method of generating a signal representative of a geomagnetic field of claim 13, wherein said step of providing a first plurality of magneto-resistive sensors comprises providing at least one pair of the first plurality of magneto-resistive sensors at right angles to each other.

15. The method of generating a signal representative of a geomagnetic field of claim 13, wherein said step of providing a first plurality of magneto-resistive sensors comprises providing four magneto-resistive effect devices circumferentially spaced at intervals of ninety degrees.

16. The method of generating a signal representative of a geomagnetic field of claim 13, further comprising a step of providing a plurality of temperature compensation magneto-resistive sensors formed on the substrate adjacent to the magnetic cores at right angles to corresponding ones of the first plurality of sensors.

17. The method of generating a signal representative of a geomagnetic field of claim 13, further comprising a step of providing at least one excitation coil formed on one of said cores.

18. The method of generating a signal representative of a geomagnetic field of claim 13, wherein the step of providing the magneto-resistive sensors comprises locating said magneto-resistive sensors in said gaps.

* * * * *